(12) United States Patent
Morihara et al.

(10) Patent No.: US 10,111,350 B2
(45) Date of Patent: Oct. 23, 2018

(54) ASSEMBLY STRUCTURE FOR CASING OF ELECTRONIC DEVICE, AND ELECTRONIC DEVICE

(71) Applicant: MITSUBISHI ELECTRIC CORPORATION, Tokyo (JP)

(72) Inventors: Takafumi Morihara, Tokyo (JP); Satoru Yamamoto, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/576,561

(22) PCT Filed: Aug. 4, 2015

(86) PCT No.: PCT/JP2015/072038
§ 371 (c)(1),
(2) Date: Nov. 22, 2017

(87) PCT Pub. No.: WO2017/022068
PCT Pub. Date: Feb. 9, 2017

(65) Prior Publication Data
US 2018/0213661 A1    Jul. 26, 2018

(51) Int. Cl.
*H05K 7/12* (2006.01)
*H05K 5/02* (2006.01)
*B60R 16/03* (2006.01)
*H05K 7/14* (2006.01)
*H05K 7/20* (2006.01)

(52) U.S. Cl.
CPC ........... *H05K 5/0221* (2013.01); *B60R 16/03* (2013.01); *H05K 7/12* (2013.01); *H05K 7/1427* (2013.01); *H05K 7/20* (2013.01)

(58) Field of Classification Search
None
See application file for complete search history.

(56) References Cited

U.S. PATENT DOCUMENTS

| | | | | |
|---|---|---|---|---|
| 4,901,882 A | * | 2/1990 | Goncalves | A45C 13/1084 220/324 |
| 4,951,716 A | * | 8/1990 | Tsunoda | H02G 3/0418 138/157 |
| 5,131,558 A | * | 7/1992 | Hiromori | A45C 13/1084 220/326 |
| 5,135,126 A | * | 8/1992 | Petit | A45C 13/1084 220/324 |

(Continued)

FOREIGN PATENT DOCUMENTS

| | | |
|---|---|---|
| JP | 53-088768 U1 | 7/1978 |
| JP | 11-4393 A | 1/1999 |

(Continued)

*Primary Examiner* — Courtney Smith
(74) *Attorney, Agent, or Firm* — Birch, Stewart, Kolasch & Birch, LLP

(57) ABSTRACT

An opening is formed in a top plate, and an opening is formed in a side plate which is approximately orthogonal to the top plate. A wall extending from a part of an edge part of the opening part and recessed toward the internal side of a casing includes an inclined surface inclined radially from the internal side of the casing to an edge part of the opening part and facing the opening part and the opening part.

7 Claims, 5 Drawing Sheets

(56) References Cited

U.S. PATENT DOCUMENTS

| | | | | |
|---|---|---|---|---|
| 5,411,163 A * | 5/1995 | Gueret | ............... | A45C 13/1084 |
| | | | | 215/237 |
| 5,823,341 A * | 10/1998 | Nakasuji | ............. | E05B 73/0023 |
| | | | | 206/387.11 |
| 6,754,088 B2 * | 6/2004 | Takeda | ................. | H05K 9/0073 |
| | | | | 174/363 |
| 7,050,305 B2 * | 5/2006 | Thorum | ............... | H05K 5/0013 |
| | | | | 165/185 |
| 7,429,700 B2 * | 9/2008 | Kanamaru | ........... | H01R 13/506 |
| | | | | 174/135 |
| 7,918,357 B2 * | 4/2011 | Jaeb | .................... | A45C 13/1084 |
| | | | | 206/307 |
| 7,944,690 B2 * | 5/2011 | Yamagiwa | ........... | H05K 5/0013 |
| | | | | 29/426.1 |
| 8,045,337 B2 * | 10/2011 | Morales | ................. | E05B 77/34 |
| | | | | 361/800 |
| 2005/0145410 A1 * | 7/2005 | Daito | ................. | B60R 16/0215 |
| | | | | 174/72 A |
| 2013/0264866 A1 | 10/2013 | Asakura | | |

FOREIGN PATENT DOCUMENTS

| | | | |
|---|---|---|---|
| JP | 2002-203456 | A | 7/2002 |
| JP | 2007-235055 | A | 9/2007 |
| JP | 2012-94780 | A | 5/2012 |
| JP | 2015-95522 | A | 5/2015 |

* cited by examiner

ASSEMBLY STRUCTURE FOR CASING OF ELECTRONIC DEVICE, AND ELECTRONIC DEVICE

TECHNICAL FIELD

The present invention relates to an assembly structure for a casing of an electronic device for discharging foreign substances passed through an opening formed on the top surface or the like of the casing without allowing foreign substances to intrude into the casing.

BACKGROUND ART

When foreign substances such as water, dust, or the like intrude into an electronic device from the outside, electronic components on a circuit board disposed in the electronic device may be short-circuited, causing serious failures. Thus, it is preferred that the openings formed on the casing of the electronic device is reduced to be minimal in order to prevent foreign substances from intruding inside.

However, in some cases, it is required to form an opening on a casing of an electronic device due to the configuration of the casing. For example, an opening may be needed to mount another component to the electronic device, or an opening may be needed for heat dissipation of the electronic device.

Thus, Patent Literature 1, for example, discloses a structure of a drop prevention wall that is provided with a terminal block placed in a casing of an inverter. The drop prevention wall prevents foreign substances from further intruding beyond the terminal block, when they intrude through a service hole formed on the casing to access to the terminal block.

CITATION LIST

Patent Literature

[Patent Literature 1]
Japanese Patent Application Publication No. 2012-94780

SUMMARY OF INVENTION

Technical Problem

In the structure described in Patent Literature 1, however, foreign substances remain in the electronic device after all. Although Patent Literature 1 refers to a scattering prevention wall that prevents foreign substances remaining inside from scattering caused by external vibration, movement of the electronic device or the like, the structure may allow the remaining foreign substances to scatter and escape from the scattering prevention wall, and there is still a possibility that foreign substances are scattered in the electronic device and reach the circuit board.

The present invention has been made to solve the above mentioned problem, and an object of the present invention is to provide an assembly structure for a casing of an electronic device that can discharge foreign substances passed through an opening formed on the top surface or the like of the casing without allowing foreign substances to intrude into the casing.

Solution to Problem

An assembly structure for a casing of an electronic device according to the present invention includes: a first opening part formed in an edge part of a surface of the casing; a second opening part formed in an edge part of a surface crossing the surface in which the first opening part is formed; and a wall extending from a part of an edge part of the second opening part and recessed toward an internal side of the casing. The wall has an inclined surface on a recessed side which inclines from an internal side of the casing to an edge part of the second opening part, and the inclined surface faces the first opening part and the second opening part.

ADVANTAGEOUS EFFECTS OF INVENTION

According to the present invention, the foreign substances passed through an opening provided in the top surface or the like of a casing can be discharged without allowing foreign substances to intrude into the casing.

DESCRIPTION OF EMBODIMENTS

Some embodiments of the present invention will now be described for explaining the invention in more detail with reference to the accompanying drawings.

Embodiment 1

Figure 1:
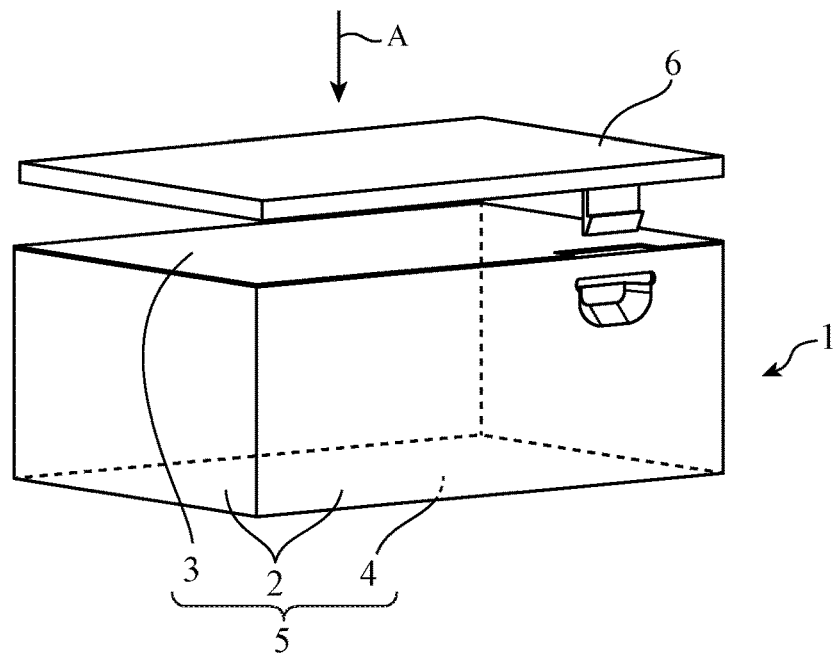
FIG. 1 is a perspective view of an electronic device according to Embodiment 1 of the present invention.

FIG. 1 illustrates a perspective view of an electronic device 1 according to Embodiment 1 of the present invention. The electronic device 1 includes a roughly box-shaped casing 5 having side plates 2, a top plate 3, a bottom plate 4, and a circuit board or the like (not shown), on which electronic components are mounted, accommodated in the casing 5. The side plates 2, the top plate 3, and the bottom plate 4 are formed by machining of a sheet metal, for example. Here, the side plates 2 mean four side surfaces in total which are approximately orthogonal to the top plate 3 and the bottom plate 4. When the electronic device 1 is assembled, for example, the side plates 2 and the bottom plate 4 are combined to be a box shape having an open top, and then a circuit board (not shown) or the like is accommodated inside, and the top plate 3 is mounted as a lid.

Further, a mounting component 6 is attached to the electronic device 1 along the direction A in FIG. 1. The electronic device 1 is a car navigation device, for example, and the mounting component 6 is a bracket, for example.

Figure 2:
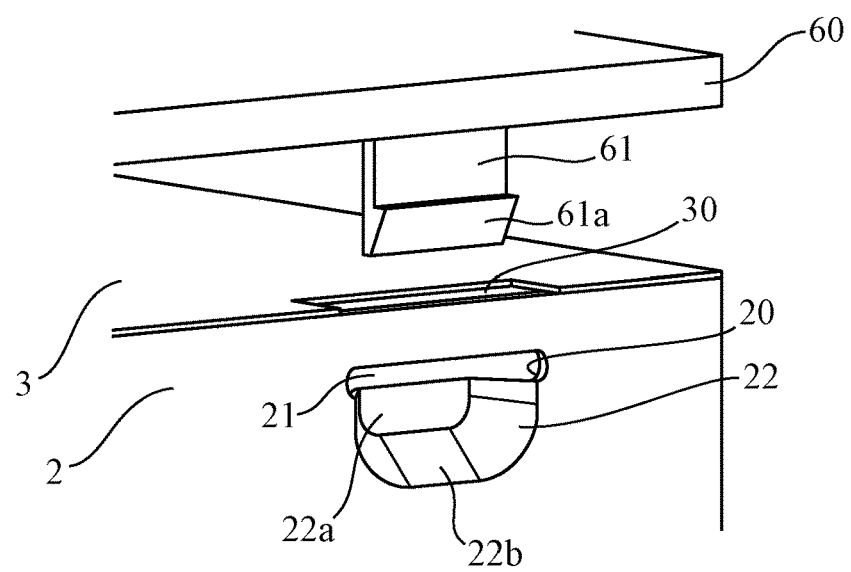
FIG. 2 is a partial enlarged view of FIG. 1.
Figure 3:
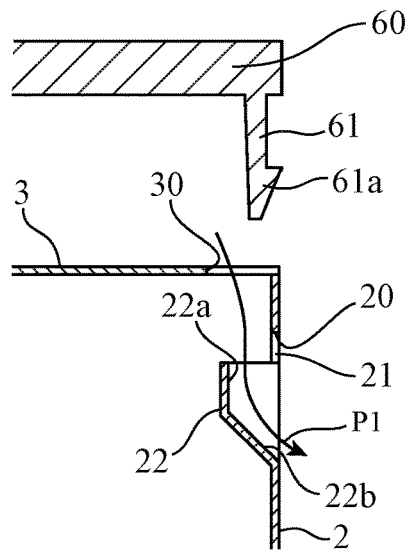
FIG. 3 is a cross-sectional view of a region around openings respectively provided in a top plate and a side plate of the electronic device according to Embodiment 1 of the present invention.

FIG. 2 is a partial enlarged view of FIG. 1. FIG. 3 is a cross-sectional view of the portion illustrated in FIG. 2.

In the top plate 3, which forms the top surface of the casing 5, an opening part 30 is formed by punching, for example, a part of its edge part in an approximately rectangle shape. Further, an approximately D shaped opening part 20 is formed in an edge part of the side plate 2 which forms a side surface of the casing 5 and formed to be approximately orthogonal to the top plate 3. The opening part 20 and the opening part 30 are formed such that their respective positions in the longitudinal direction of the side of the casing 5 formed by the side plate 2 and the top plate 3 are aligned to each other when the side plate 2 and the top plate 3 are attached to each other.

A portion around a straight edge part in the upper end side of the opening part 20 is a through hole 21. On the other hand, from the other curved edge part of the opening part 20, a wall 22 is formed as a whole to extend to be recessed toward the internal side of the casing 5. In the surface of the wall 22 facing the outer side of the casing 5, namely, in the recessed side surface of the wall 22, an inclined surface 22b which is inclined radially from a bottom surface 22a positioned to be recessed toward the internal side of the casing 5 to the edge part of the opening part 20 is formed. Since the inclined surface 22b is inclined radially, most of the inclined surface 22b faces both the openings 20 and 30.

The wall 22 is formed by, for example, drawing into the shape described above.

The mounting component 6 includes a plate part 60 and an elastic piece 61 approximately vertically protruding from the plate part 60 and having a hook 61a at its tip.

The mounting component 6 is attached to the electronic device 1 by snap-fit. Namely, the tip of the elastic piece 61 is inserted from the opening part 30, and then the hook 61a is fit into the through hole 21 by means of the elasticity of the elastic piece 61. The hook 61a of the elastic piece 61 passed through the opening part 30 is thereby latched at the upper end side edge part of the opening part 20, and as a result, the mounting component 6 and the electronic device 1 are fixed to each other.

The opening part 30 is not covered at all and is completely exposed to the outside before the mounting component 6 is fixed to the electronic device 1. Thus, in a case where a through hole such as the through hole 21 is formed in the side plate 2 without providing any other countermeasure, external foreign substances may pass through the opening part 30 and intrude into the casing 5. In this Embodiment 1, however, foreign substances passed through the opening part 30 are received by the wall 22, move along the inclined surface 22b inclined radially from the internal side of the casing 5 to the edge part of the opening part 20, and are discharged from the opening part 20. Therefore, even if foreign substances pass through the opening part 30, they are discharged without intruding into the internal space of the casing 5 where a circuit board (not shown) or the like is accommodated. FIG. 3 illustrates a moving path P1 of foreign substances in this case.

Note that, after the mounting component 6 is attached, since the opening part 30 is covered by the plate part 60, the possibility that foreign substances intrude through the opening part 30 is low. Also in such a case, foreign substances are discharged from the opening part 20 on which the wall 22 is formed, similarly to the case before attachment of the mounting component 6.

In this manner, the foreign substances passed through the opening part 30 are discharged from the opening part 20. In this structure, since foreign substances do not remain in the casing 5, there is no risk that remaining foreign substances scatter in the electronic device 1 due to vibration given from outside, movement of the electronic device 1, or the like. In particular, in the case that the electronic device 1 is an on-vehicle electronic device, external vibration is given to the electronic device 1 frequently. Therefore, the structure described above capable of discharging foreign substances without allowing foreign substances to remain inside is suitable for on-vehicle electronic devices in particular.

In the above, the following case is explained as an example: the opening part 30 is required to be formed for fixing the electronic device 1 and the mounting component 6 to each other by snap-fit, though the opening part 30 may be an inlet for intrusion of foreign substances. However, there is also a following case: an opening part which corresponds to the opening part 30 is formed as an intake hole or discharging hole of heat dissipation air. Also for such an opening part, by forming an opening part 20 with a wall 22 extending from the edge part of the opening part 20, the structure for discharging foreign substances as described above can be employed. In short, it is possible to prevent foreign substances from intruding into the internal space of the casing 5 where a circuit board or the like is arranged and discharge the foreign substances, by forming an opening part 20 with a wall 22 extending from the edge part of the opening part 20 correspondingly to an opening part of any purposes which is necessary for configuration of the electronic device 1 and can be an inlet for intrusion of foreign substances at the same time.

In the above configuration, the opening part 20 with a wall 22 extending from the edge part of the opening part 20 is formed correspondingly to the opening part 30 provided in the top plate 3 forming the top surface of the casing 5 to discharge foreign substances. On the other hand, the opening part 20 having the wall 22 extending from the edge part of the opening part 20 may be formed in the side plate 2 correspondingly to an opening provided in the bottom plate 4 forming the bottom surface of the casing 5 to discharge foreign substances. In this case, the wall 22 extending from the edge part of the opening part 20 has an inclined surface inclined radially from the internal side of the casing 5 and facing both the opening part 20 and the opening provided in the bottom plate 4. For example, in some cases, an opening part corresponding to the opening part 30 is formed in the bottom plate 4 because the mounting component 6 is attached not to cover the top plate 3 as shown in the drawings, but to cover the bottom plate 4. In addition, there is a case that, in mounting the mounting component 6 on the bottom plate 4, the casing 5 is transported or the mounting operation of the mounting component 6 is performed in a state where the bottom plate 4 in which an opening part is formed is directed upwardly. In such a case, the opening provided in the bottom plate 4 can be an inlet for intrusion of foreign substances; however, by forming the opening part 20 with the wall 22 extending from the edge part of the opening part 20 in the side plate 2, foreign substances can be discharged. Similar configuration can be employed for a case where an opening part is formed in a side plate 2 forming a side surface of the casing 5 for mounting the mounting component 6 to cover the side plate 2.

As described above, an opening provided in the bottom plate 4 or the side plate 2 of the casing 5 can be an inlet for intrusion of foreign substances in some cases. Thus, it is preferred to form an opening part for discharging foreign substances corresponding to the opening part 20 for each opening part formed in the casing 5 in accordance with the situation.

As described above, according to the electronic device 1 of this Embodiment 1, in the wall 22 which extends from a part of the edge part of the opening part 20 and is recessed toward the internal side of the casing 5, the inclined surface 22b, which inclines radially from the internal side of the casing 5 to an edge part of the opening part 20, faces the opening part 30 and the opening part 20. As a result of such a configuration, foreign substances passed through the opening part 30 move along the inclined surface 22b and are discharged from the opening part 20. Thus, a failure which may occur caused by intrusion of foreign substances into the casing 5 accommodating a circuit board or the like can be prevented.

Embodiment 2

Figure 4:
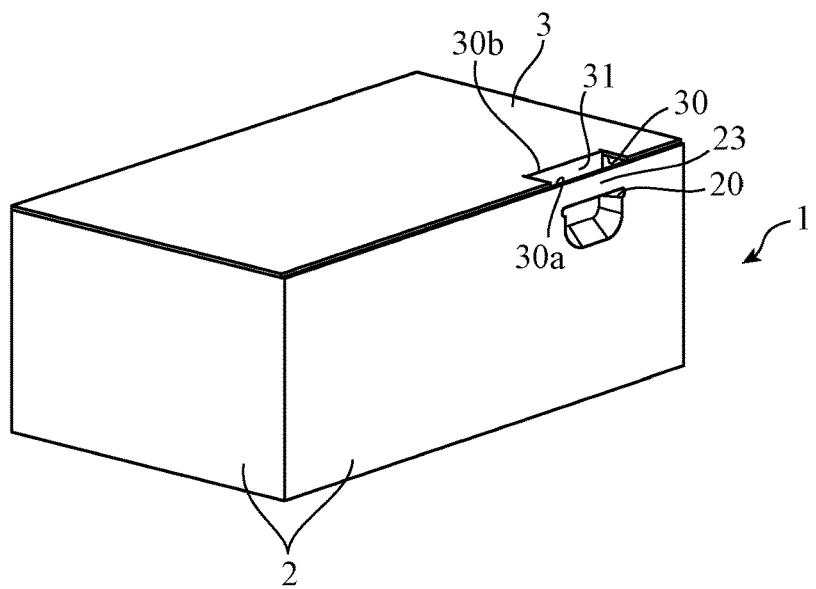
FIG. 4 is a perspective view of an electronic device according to Embodiment 2 of the present invention.
Figure 5:
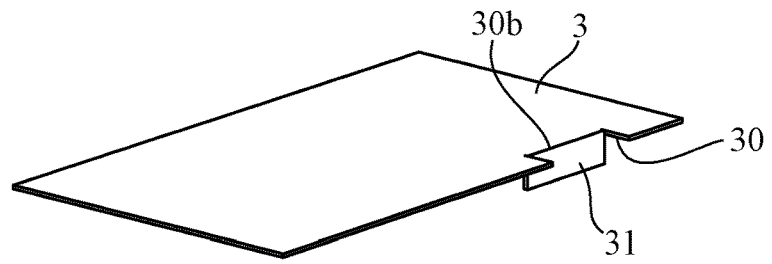
FIG. 5 is a perspective view of the top plate extracted from FIG. 4.

FIG. 4 is a perspective view of an electronic device 1 according to Embodiment 2 of the present invention. FIG. 5 illustrates a top plate 3 extracted from FIG. 4. The top plate 3 of Embodiment 2 includes a hanging wall 31 that is formed by, for example, bending processing and approximately orthogonally extends from an edge part of the opening part 30 to the internal side of the casing 5.

The hanging wall 31 extends from an edge part 30b opposing an edge part 30a near the opening part 20 among the edge parts of the opening part 30.

Figure 6:
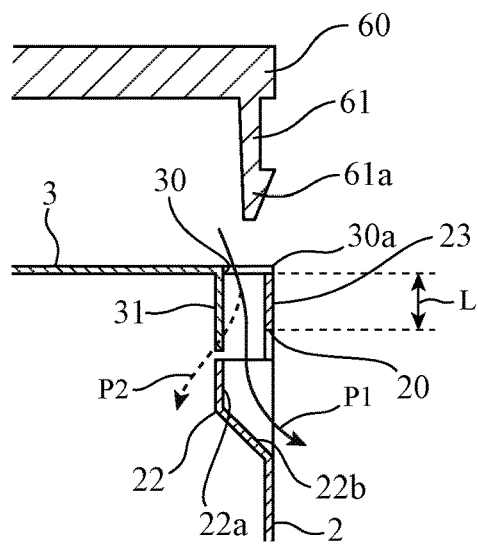
FIG. 6 is a cross-sectional view of a region around openings respectively provided in a top plate and a side plate of an electronic device according to Embodiment 2 of the present invention.

FIG. 6 is a cross-sectional view of a casing 5 in the vicinity of the openings 20 and 30 and further illustrates a mounting component 6 before mounting. The lower end of the hanging wall 31 is positioned near the upper end of the wall 22.

Similarly to the case described in Embodiment 1, foreign substances passed through the opening part 30 are received by the wall 22, move along the inclined surface 22b inclined radially from the internal side of the casing 5 to an edge part of the opening part 20, and are discharged from the opening part 20. Further, because the hanging wall 31 exists, it is possible to prevent the foreign substances passed through the opening part 30 from being not discharged from the opening part 20 and moving along the moving path P2 so that the foreign substances intrude into the internal space of the casing 5. Consequently, the foreign substances passed through the opening part 30 can be discharged more securely.

Some advantages of the hanging wall 31 in a case where the opening part 20 and the opening part 30 are used to mount the mounting component 6 by snap-fit will now be described. In this case, the load from the mounting component 6 is applied to an engagement part 23 being a part from the upper end side edge part of the opening part 20 at which the elastic piece 61 is latched to the edge part 30a of the opening part 30 opposing the upper end side edge part. Thus, it is required to ensure the strength of the engagement part 23 to bear the load from the mounting component 6.

For example, by increasing the width L of the engagement part 23 in the vertical direction, the strength of the engagement part 23 is ensured. However, to increase the width L of the engagement part 23 in the vertical direction, it is required to form the opening part 20 in lower side at a position farther from the opening part 30, and the distance between the upper end of the wall 22 and the opening part 30 is increased accordingly. Namely, foreign substances passed through the opening part 30 are more likely to intrude into the casing 5 without being received by the wall 22.

By forming the hanging wall 31, the possibility of such intrusion can be suppressed, while enhancing the strength by increasing the width L of the engagement part 23 in the vertical direction.

Figure 7:
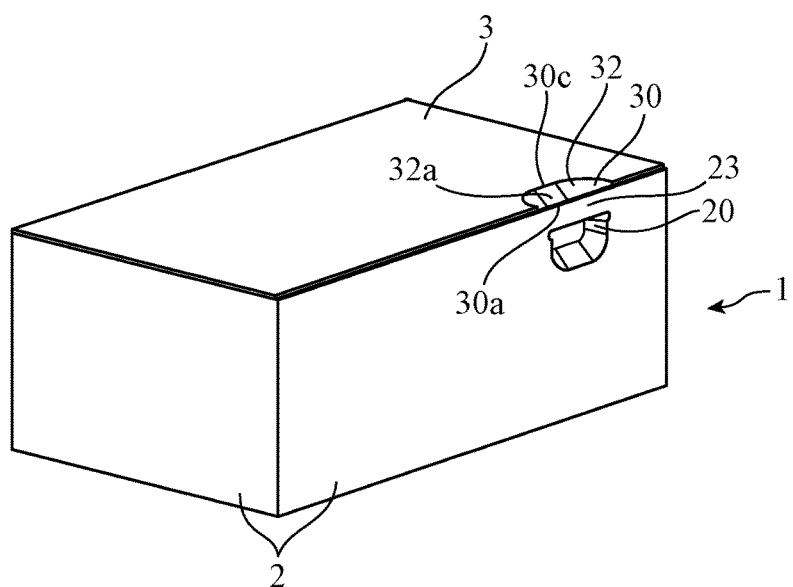
FIG. 7 is a perspective view illustrating a modification example of the electronic device in Embodiment 2 according to the present invention.
Figure 8:
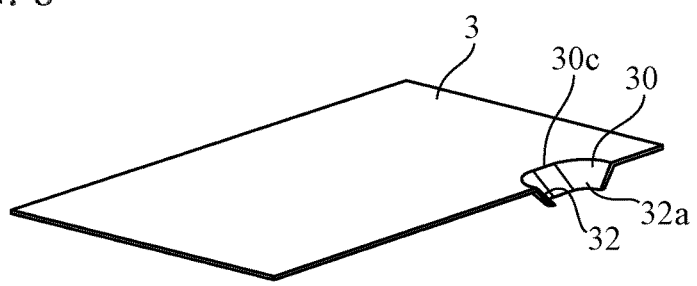
FIG. 8 is a perspective view of the top plate extracted from FIG. 7.
Figure 9:
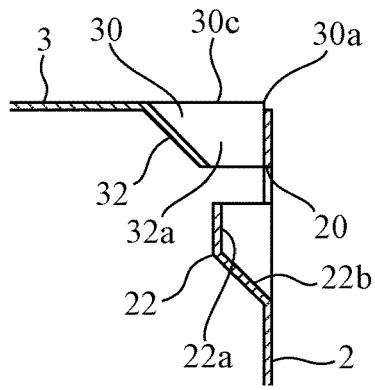
FIG. 9 is a cross-sectional view of a region around openings respectively provided in the top plate and the side plate in the modification example of the electronic device according to Embodiment 2 of the present invention.

As illustrated in the perspective views of FIGS. 7 and 8, it is also preferred to provide a hanging wall 32 that has a surface 32a inclined radially from the internal side of the casing 5 to an arcuate edge part 30c of the approximately semicircular opening part 30. The hanging wall 32, which extends to the internal side of the casing 5, is formed by, for example, drawing similarly to the wall 22. The edge part 30c faces the edge part 30a. FIG. 9 is a cross-sectional view of the casing 5 in the vicinity of the openings 20 and 30 showing the hanging wall 32.

Whole of the rectangular hanging wall 31 illustrated in FIGS. 4 to 6 is a wall extending in parallel with the longitudinal direction of the opening part 30. On the other hand, the hanging wall 32 illustrated in FIGS. 7 to 9 having the inclined surface 32a is a wall partially crossing the longitudinal direction of the opening part 30. Thus, the hanging wall 32 can prevent foreign substances passed through the opening part 30 from intruding into the casing 5 without being received by the wall 22 in a wider area than the hanging wall 31.

As described above, according to the electronic device 1 of this Embodiment 2, by providing the hanging walls 31, 32 extending from the edge part of the opening part 30, foreign substances passed through the opening part 30 are discharged from the opening part 20 more securely.

Embodiment 3

Figure 10:
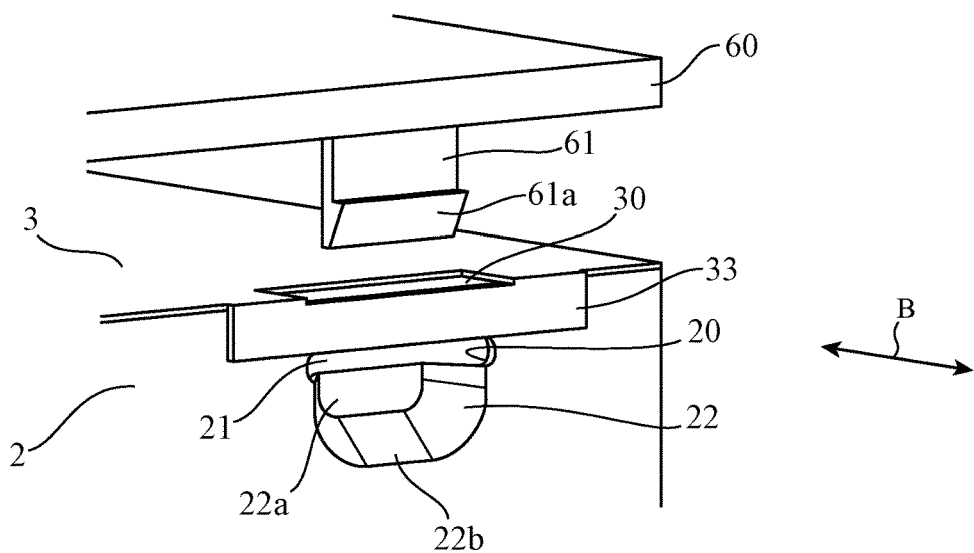
FIG. 10 is a partial enlarged perspective view of an electronic device according to Embodiment 3 of the present invention.

FIG. 10 is a perspective view of the electronic device 1 according to Embodiment 3 of the present invention. FIG. 10 illustrates only the openings 20 and 30 and their neighboring region.

The top plate 3 has an overlapping wall 33 formed by bending the top plate 3 at its edge part approximately orthogonally and extending along the surface of the side plate 2. The overlapping wall 33 overlaps with the engagement part 23.

Not only a load from the mounting component 6 but also a load in the direction B orthogonal to a surface of the engagement part 23 may be applied to the engagement part 23 due to contact with other components caused by vibration, for example. In a case that the side plate 2 is made by machining a sheet metal, since the engagement part 23 corresponds to one sheet metal having an elongated rectangular shape, it is easily deformed when a load in the direction B orthogonal to the surface is applied.

As a result of the overlapping of the overlapping wall 33 with the engagement part 23, when an external load in the direction B is applied to the engagement part 23, it is possible to receive the load by two sheet metals, namely, the engagement part 23 and the overlapping wall 33. Hence, even when a load in the direction B is applied to the engagement part 23, the deformation can be suppressed.

Figure 11:
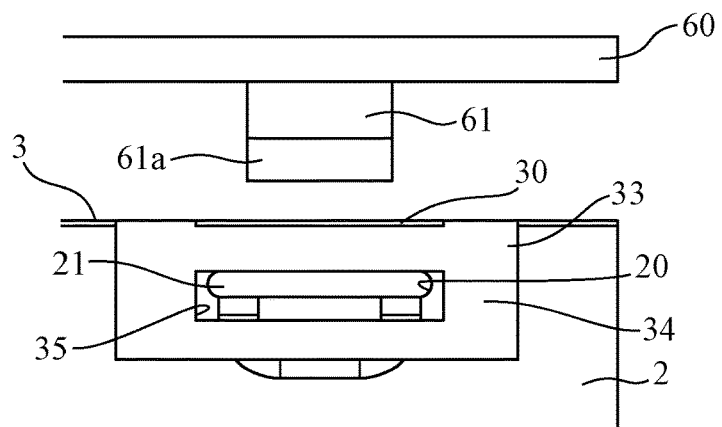
FIG. 11 is a side view of a region around an opening provided in a side plate in a modification example of the electronic device according to Embodiment 3 of the present invention.

FIG. 11 is a side view of a region around the opening part 20 of the casing 5 in the case that an overlapping wall 34 which is a part further extending from the overlapping wall 33 and integrally formed with the overlapping wall 33 is provided. As a result of such a configuration, the area that can receive the load applied in the direction B orthogonal to a surface of the engagement part 23 by two sheet metals can be increased, and it is possible to enhance the strength in a wide area including an area around the opening part 20.

In the case that the overlapping wall 34 is provided, the lower end of the overlapping wall 34 is arranged to be positioned in an upper side of the lower end of the opening part 20 to discharge foreign substances from the opening part 20. An opening 35 is provided in the overlapping wall 34 such that a hook 61*a* of the elastic piece 61 fit into the through hole 21 by snap-fit does not interfere with the overlapping wall 34. The opening 35 enables the overlapping wall 34 to avoid the hook 61*a* of the elastic piece 61 latched at the edge part of the opening part 20 and to overlap with the opening part 20.

Figure 12:
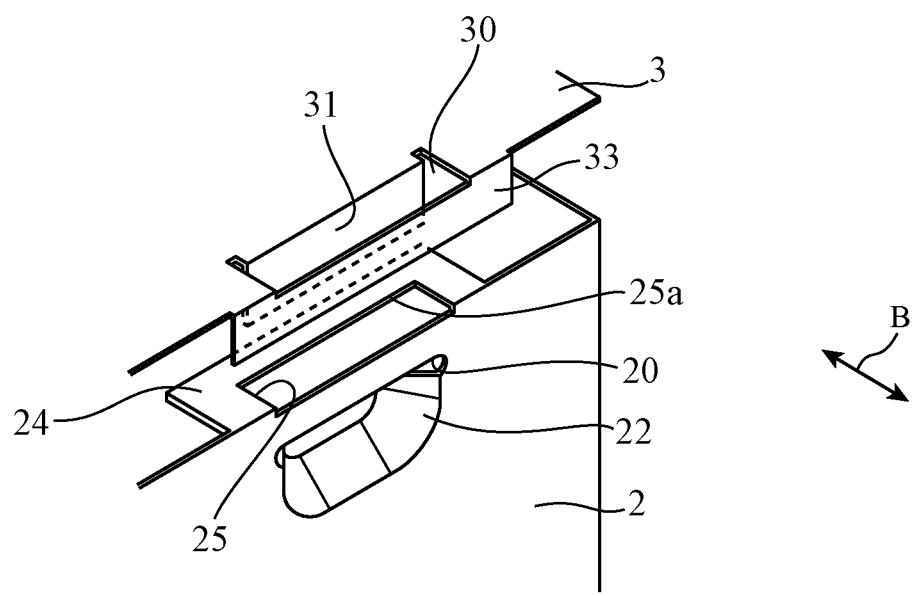
FIG. 12 is a partial enlarged exploded perspective view of the modification example of the electronic device according to Embodiment 3 of the present invention.

Further, as illustrated in the exploded perspective view of FIG. 12, it is also preferred that a hanging wall 31 and an overlapping wall 33 are provided with the top plate 3, and the side plate 2 is approximately orthogonally bent at its edge part to form a regulation wall 24 extending to the backside of the top plate 3. The regulation wall 24 has an opening part 25, into which the hanging wall 31 is inserted after the side plate 2 and the top plate 3 are attached to each other. Then, an edge part 25*a* along the hanging wall 31 among the edge parts of the opening part 25 comes into contact with the hanging wall 31. Consequently, when an external load in the direction B is applied, reaction forces are generated between the edge part 25*a* and the hanging wall 31 and their displacement relative to each other can be regulated, and as a result, the strength against the load in the direction B is further enhanced.

Note that the top plate 3 in FIG. 12 may have the overlapping wall 34 in addition to the overlapping wall 33 as illustrated in FIG. 11. Further, the hanging wall 32 may be provided with the top plate 3 instead of the hanging wall 31. In this case, the opening part 25 is formed to have an arcuate edge part to conform to the hanging wall 32.

As described above, according to the electronic device 1 of this Embodiment 3, by providing the overlapping wall 33, the overlapping wall 34, the regulation wall 24, etc., it is possible to discharge foreign substances passed through the opening part 30 from the opening part 20, enhance the strength against an external load and suppress the deformation.

It should be noted that the present invention can include any combination of individual embodiments, modifications of any component in each embodiment, or omission of any component in each embodiment within the scope of the invention.

INDUSTRIAL APPLICABILITY

As described above, the assembly structure for a casing of an electronic device according to the present invention can discharge foreign substances passed through an opening provided in, for example, the top surface of the casing and is thus suitable for use in an electronic device having a configuration in which an opening is required to be formed.

REFERENCE SIGNS LIST

1 electronic device
2 side plate
3 top plate
4 bottom plate
5 casing
6 mounting component
20 opening part
21 through hole
22 wall
22*a* bottom surface
22*b* inclined surface
23 engagement part
24 regulation wall
25 opening part
25*a* edge part
30 opening part
30*a*-30*c* edge part
31, 32 hanging wall
32*a* inclined surface
33, 34 overlapping wall
35 opening part
60 plate part
61 elastic piece
61*a* hook

The invention claimed is:

1. An assembly structure for a casing of an electronic device comprising:
   a first opening part formed in an edge part of a surface of the casing;
   a second opening part formed in an edge part of a surface crossing the surface in which the first opening part is formed; and
   a wall extending from a part of an edge part of the second opening part and recessed toward an internal side of the casing,
   wherein the wall has an inclined surface on a recessed side which inclines from an internal side of the casing to an edge part of the second opening part, and the inclined surface faces the first opening part and the second opening part.

2. The assembly structure according to claim 1, further comprising a hanging wall extending from an edge part, among an edge part of the first opening part, opposing an edge part which is positioned nearer the second opening part than other edge part of the first opening part to the internal side of the casing.

3. The assembly structure according to claim 2, wherein the hanging wall has an inclined surface inclined radially from the internal side of the casing to an edge part of the first opening part.

4. The assembly structure according to claim 1, further comprising a first overlapping wall extending to be bent from a surface on which the first opening part is formed, and overlapping with a surface on which the second opening part is formed;
   wherein the first overlapping wall is positioned between the first opening part and the second opening part.

5. The assembly structure according to claim 4, further comprising a second overlapping wall extending from the first overlapping wall and partially overlapping with the second opening part.

6. The assembly structure according to claim 4, further comprising:
   a hanging wall extending from an edge part, among an edge part of the first opening part, opposing an edge part which is positioned nearer the second opening part than other edge part of the first opening part to the internal side of the casing; and a regulation wall extending to be bent from a surface on which the second opening part is formed, and in which a third opening part into which the hanging wall is inserted is formed, wherein the regulation wall is in contact with the hanging wall at an edge part along the hanging wall among an edge part of the third opening part.

7. An electronic device comprising an assembly structure for the casing of the electronic device according to claim 1.

* * * * *